(12) United States Patent
Kim et al.

(10) Patent No.: US 8,852,853 B2
(45) Date of Patent: Oct. 7, 2014

(54) PHOTO-MASK AND METHOD FOR MANUFACTURING LIQUID CRYSTAL DISPLAY DEVICE USING THE SAME

(75) Inventors: Ki Hoon Kim, Cheonan-si (KR); Ji-Yong Park, Yongin-si (KR); Jin-Suk Park, Cheonan-si (KR); Sunghyuk Kim, Cheonan-si (KR); Min-Chang Kim, Cheonan-si (KR); Kyung Hyun Choi, Cheonan-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 155 days.

(21) Appl. No.: 13/178,013

(22) Filed: Jul. 7, 2011

(65) Prior Publication Data

US 2012/0141925 A1    Jun. 7, 2012

(30) Foreign Application Priority Data

Dec. 6, 2010    (KR) .................. 10-2010-0123795

(51) Int. Cl.
| | | |
|---|---|---|
| G03F 7/20 | (2006.01) | |
| G02F 1/1333 | (2006.01) | |
| G03F 1/54 | (2012.01) | |
| G02F 1/1337 | (2006.01) | |
| G02F 1/1341 | (2006.01) | |

(52) U.S. Cl.
CPC .............. *G02F 1/133351* (2013.01); *G02F 2001/133796* (2013.01); *G02F 2001/13415* (2013.01); *G03F 1/54* (2013.01)

USPC ............................................. 430/319; 430/20

(58) Field of Classification Search
USPC .................................................... 430/319, 20
See application file for complete search history.

(56) References Cited

U.S. PATENT DOCUMENTS

| | | | |
|---|---|---|---|
| 4,600,678 A * | 7/1986 | Adair et al. .................... | 430/138 |
| 5,978,064 A * | 11/1999 | Nishiguchi ..................... | 349/93 |
| 6,985,195 B1 * | 1/2006 | Kumagai et al. ............... | 430/319 |
| 7,061,571 B2 | 6/2006 | Liu et al. | |
| 2002/0016027 A1 * | 2/2002 | Gosain et al. .................. | 438/149 |
| 2005/0074563 A1 * | 4/2005 | Tatsuzawa et al. ............. | 428/1.1 |
| 2006/0057477 A1 * | 3/2006 | Nakazawa et al. ............. | 430/7 |
| 2006/0176439 A1 * | 8/2006 | Tashiro et al. ................. | 349/190 |
| 2006/0197901 A1 | 9/2006 | Liu et al. | |

FOREIGN PATENT DOCUMENTS

KR    10-2003-0070262    8/2003

* cited by examiner

*Primary Examiner* — Mark F Huff
*Assistant Examiner* — John S Ruggles
(74) *Attorney, Agent, or Firm* — Robert E. Bushnell, Esq.

(57) ABSTRACT

A photo-mask is capable of preventing stain defects and a method for fabricating a liquid crystal display device using the photo-mask which achieves the same capability. The photo-mask includes a transparent substrate configured to transmit ultraviolet light and a light shielding layer configured to block ultraviolet light on a surface of the transparent substrate. The light shielding layer includes an absorption layer configured to absorb ultraviolet light.

12 Claims, 14 Drawing Sheets

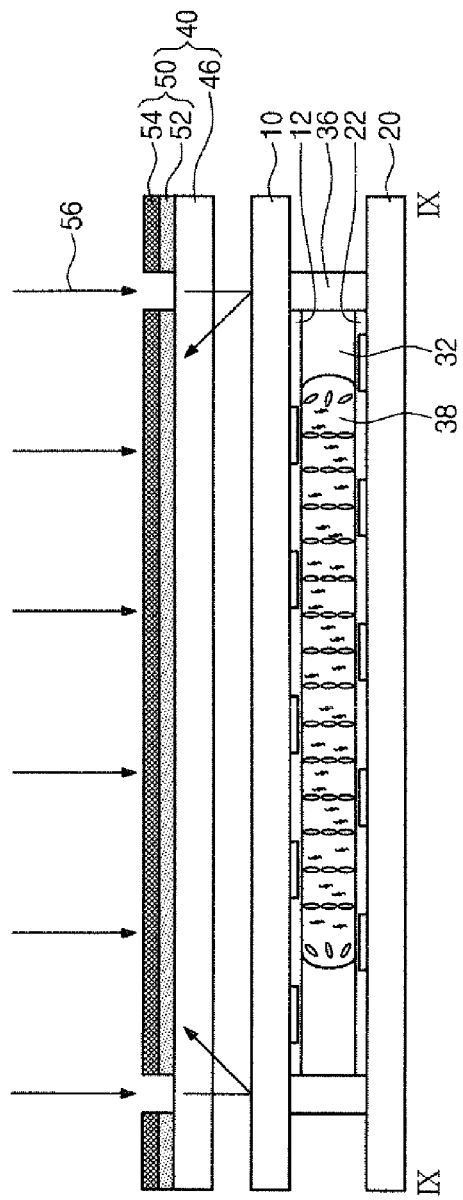
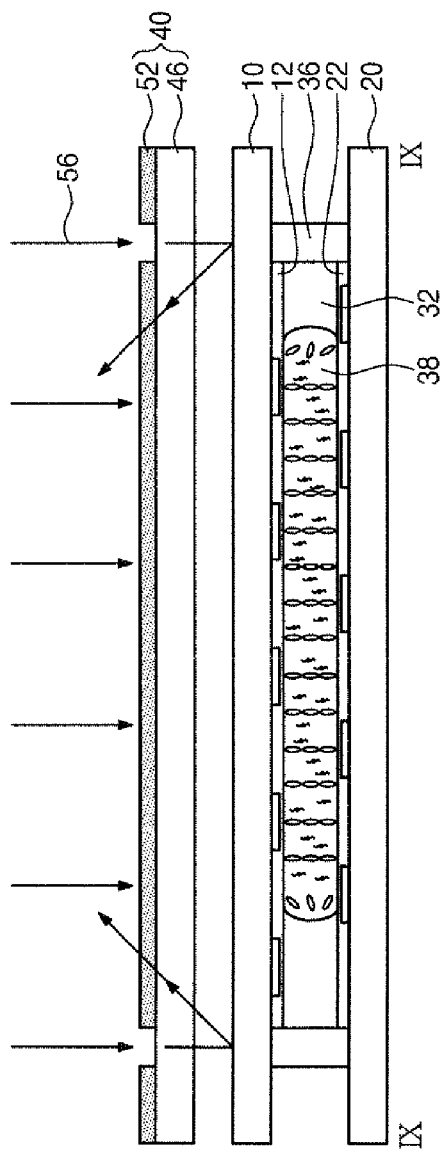

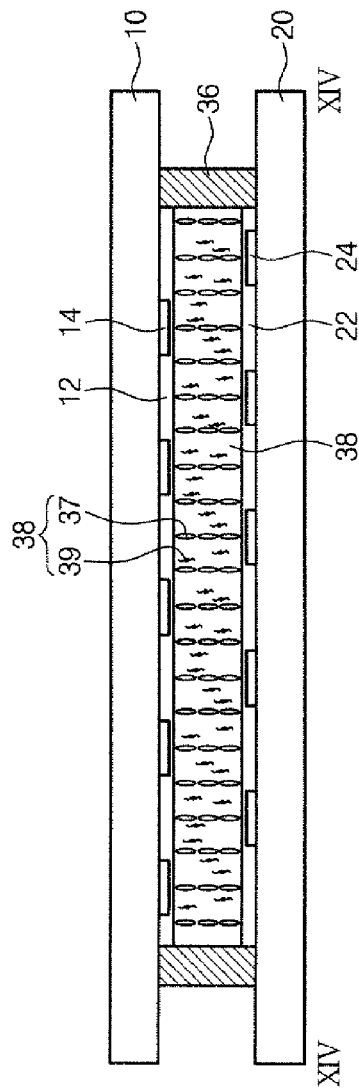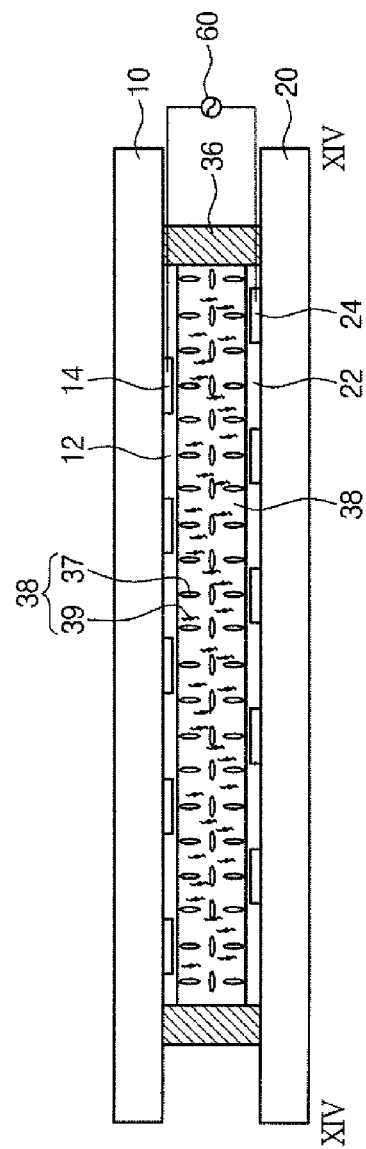

PHOTO-MASK AND METHOD FOR MANUFACTURING LIQUID CRYSTAL DISPLAY DEVICE USING THE SAME

CLAIM OF PRIORITY

This application makes reference to, incorporates the same herein, and claims all benefits accruing under 35 U.S.C. §119 from an application earlier filed in the Korean Intellectual Property Office on the Dec. 6, 2010 and there duly assigned Serial No. 10-2010-0123795.

BACKGROUND OF THE INVENTION

1. Field of the Invention

The present invention relates to a method for manufacturing a display device, and more particularly, to a photo-mask which selectively blocks ultraviolet light and a display device adopting the same.

2. Description of the Related Art

Generally, a display device may include a liquid crystal between a plurality of substrates which face each other. The liquid crystal may be sealed between the substrates by a sealant. The sealant may be hardened by ultraviolet light after the substrates are bonded to each other. However, ultraviolet light may also radiate to the liquid crystal, causing stain defects.

SUMMARY OF THE INVENTION

The present invention provides a photo-mask capable of controlling ultraviolet light and a method for fabricating a display device using the same.

The present invention also provides a photo-mask capable of preventing stain defects and a method for fabricating a display device using the same.

Embodiments of the present invention provide photo-masks which include a transparent substrate configured to transmit ultraviolet light and a light shielding layer configured to block ultraviolet light on a surface of the transparent substrate, wherein the light shielding layer includes an absorption layer configured to absorb ultraviolet light.

In some embodiments, the absorption layer may include polycrystal silicon or amorphous silicon. The polycrystal silicon may absorb ultraviolet light having a wavelength smaller than about 380 nm.

In other embodiments, the transparent substrate may include a transmissive region and a shelter region, wherein the polycrystal silicon or the amorphous silicon may be formed at the shelter region.

In still other embodiments, the light shielding layer may further include a reflection layer on the absorption layer of the shelter region. The reflection layer may include chrome.

In even other embodiments, the polycrystal silicon may be formed over the transparent substrate, including the transmissive region and the shelter region.

In other embodiments of the present invention, methods for fabricating a liquid crystal display device comprise preparing a first substrate and a second substrate including cell regions, forming a sealant at a peripheral region of the cell regions of at least one of the first and second substrates, dispensing a liquid crystal within the cell regions, joining the first and second substrates, and selectively hardening the sealant by ultraviolet light using a photo-mask, wherein the photo-mask includes a transparent substrate configured to transmit ultraviolet light and a light shielding layer configured to block ultraviolet light on a surface of the transparent substrate, and wherein the light shielding layer includes an absorption layer configured to absorb ultraviolet light.

In some embodiments, the sealant may include a first reactive resin and a first photoinitiator. The first photoinitiator may be reactive to ultraviolet light having a wavelength range of from about 380 nm to about 400 nm. The first photoinitiator may include benzoin ether or benzophenone/amine.

In other embodiments, a layer of the liquid crystal may include a second reactive resin and a second photoinitiator. The second photoinitiator may be reactive to ultraviolet light having a wavelength smaller than about 380 nm. The photoinitiator may include thioxanthone.

In still other embodiments, the absorption layer may include polycrystal silicon or amorphous silicon. The polycrystal silicon may absorb ultraviolet light having a wavelength smaller than about 380 nm.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings:

FIGS. 9 thru 12 are cross-sectional views illustrating photo-masks sectioned along a line IX-IX of FIG. 5 according to first thru fourth embodiments of the present invention;

FIGS. 14 thru 17 are cross-sectional views along a line XIV-XIV of FIG. 7 illustrating a method for aligning a liquid crystal.

DETAILED DESCRIPTION OF THE INVENTION

Figure 1:
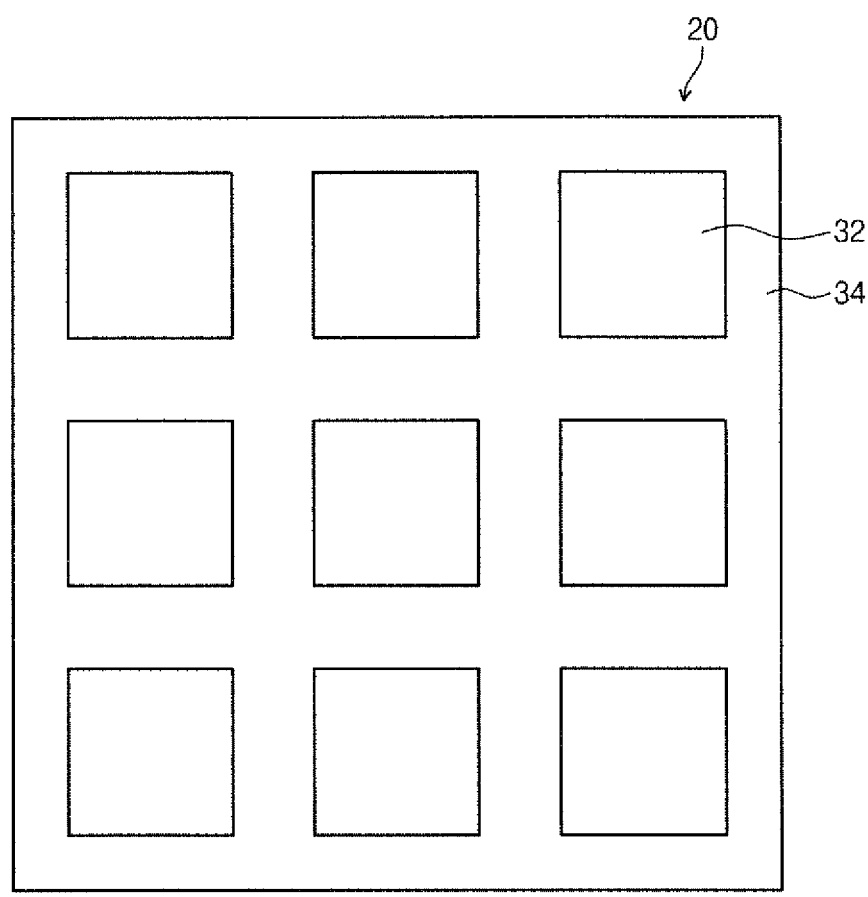
FIGS. 1 thru 7 are planar diagrams illustrating a method for fabricating a display device according to an embodiment of the present invention.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Like reference numerals refer to like elements throughout.

The terms used in the specification are not for limiting the present invention but are for describing the embodiments. The terms of a singular form may include plural forms unless otherwise specified. The meaning of the terms "include," "comprise," "including," or "comprising," specifies a property, a region, a fixed number, a step, a process, an element and/or a component but does not exclude other properties, regions, fixed numbers, steps, processes, elements and/or components. Also, the reference numerals given according to the sequence of description are not limited to the sequence.

Figure 3:
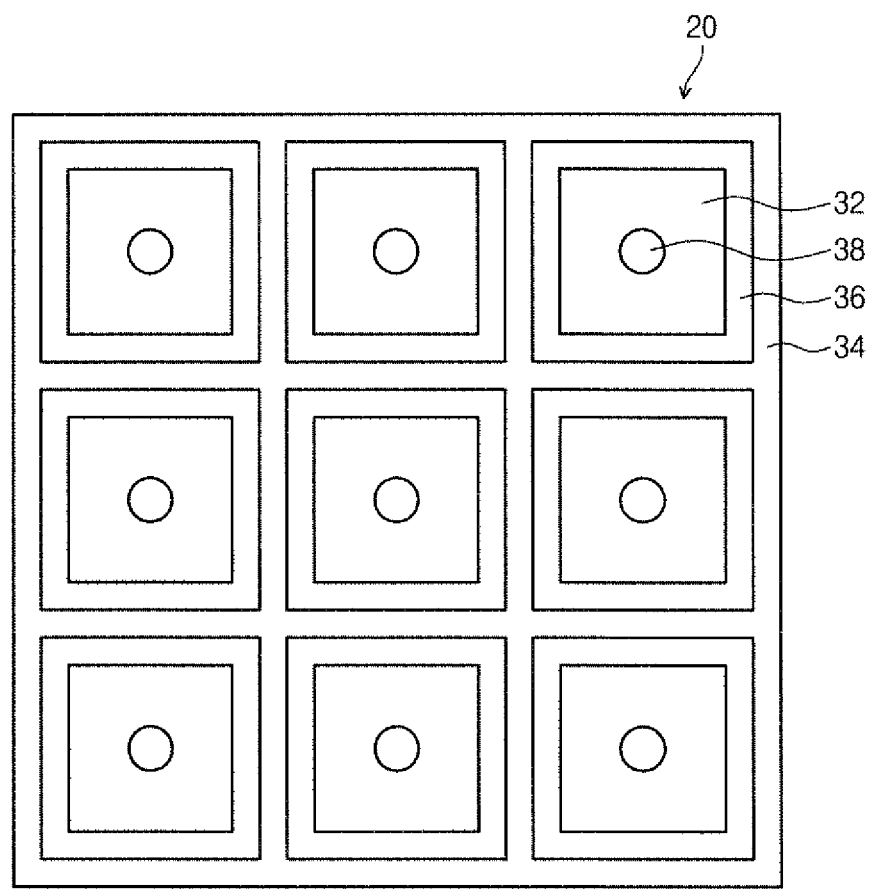
Figure 4:
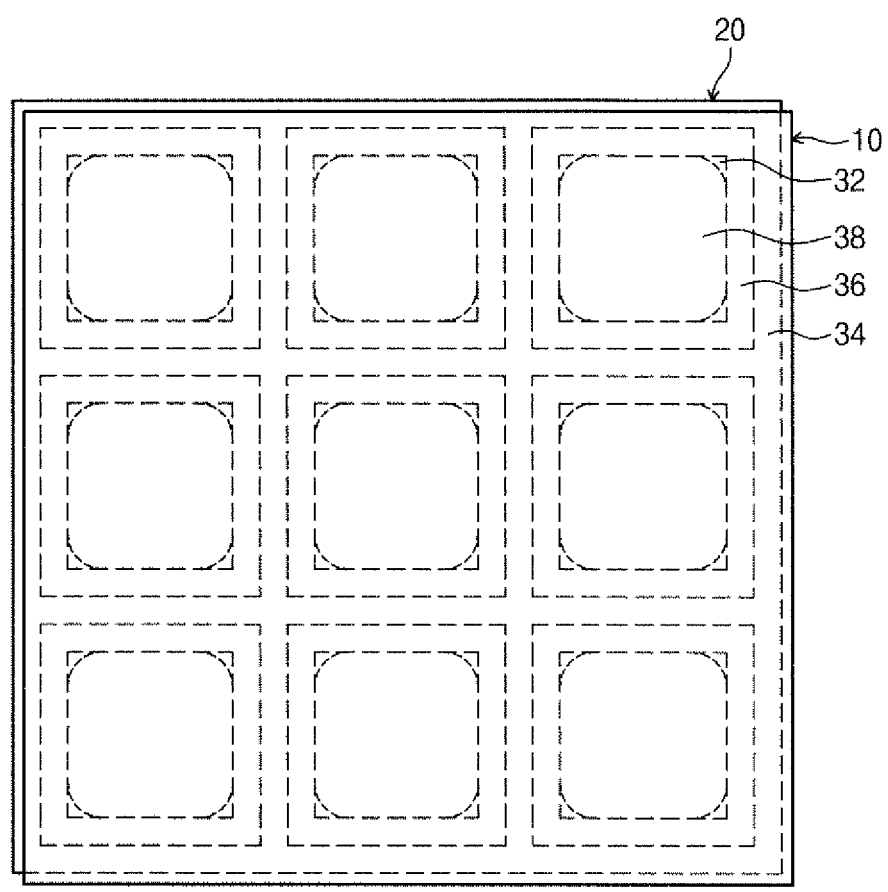
Figure 5:
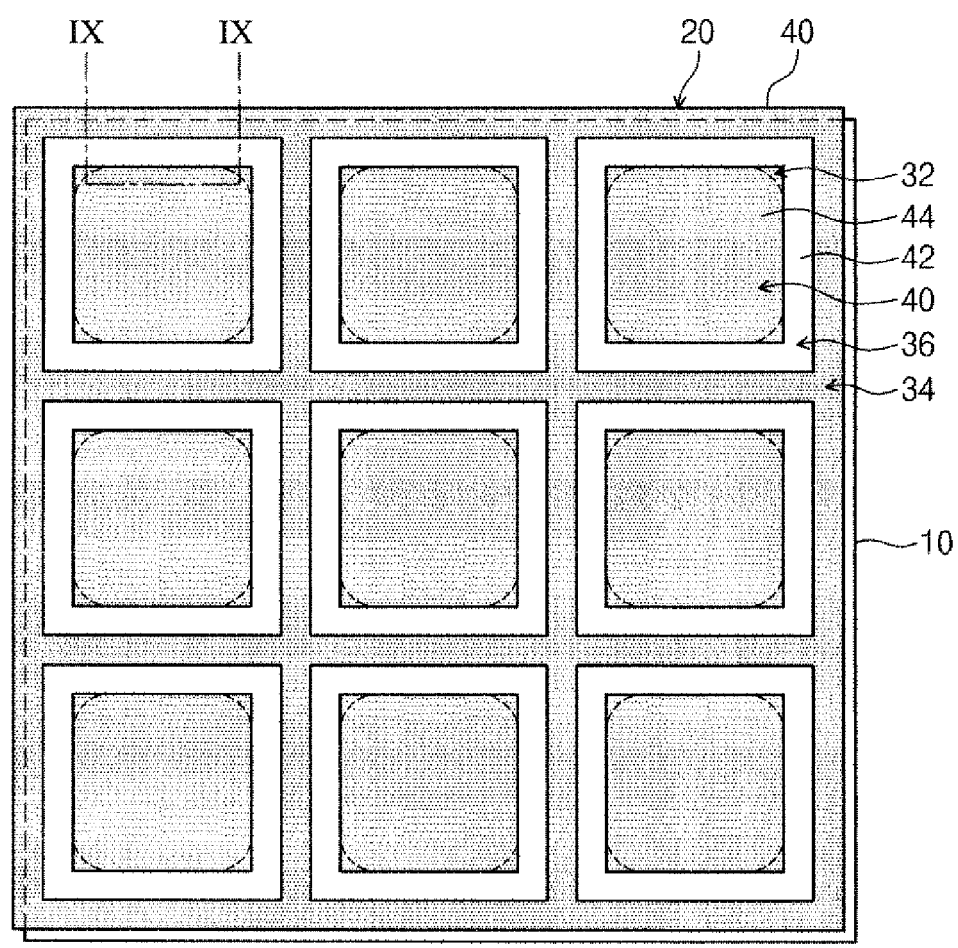
Figure 6:
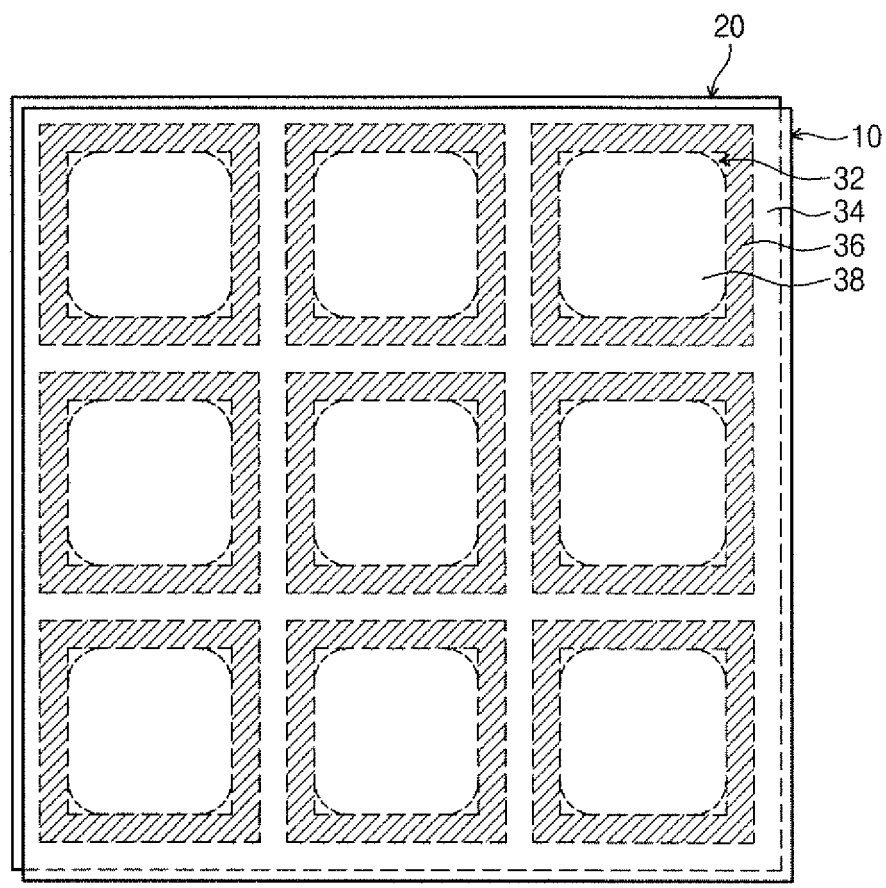
Figure 7:
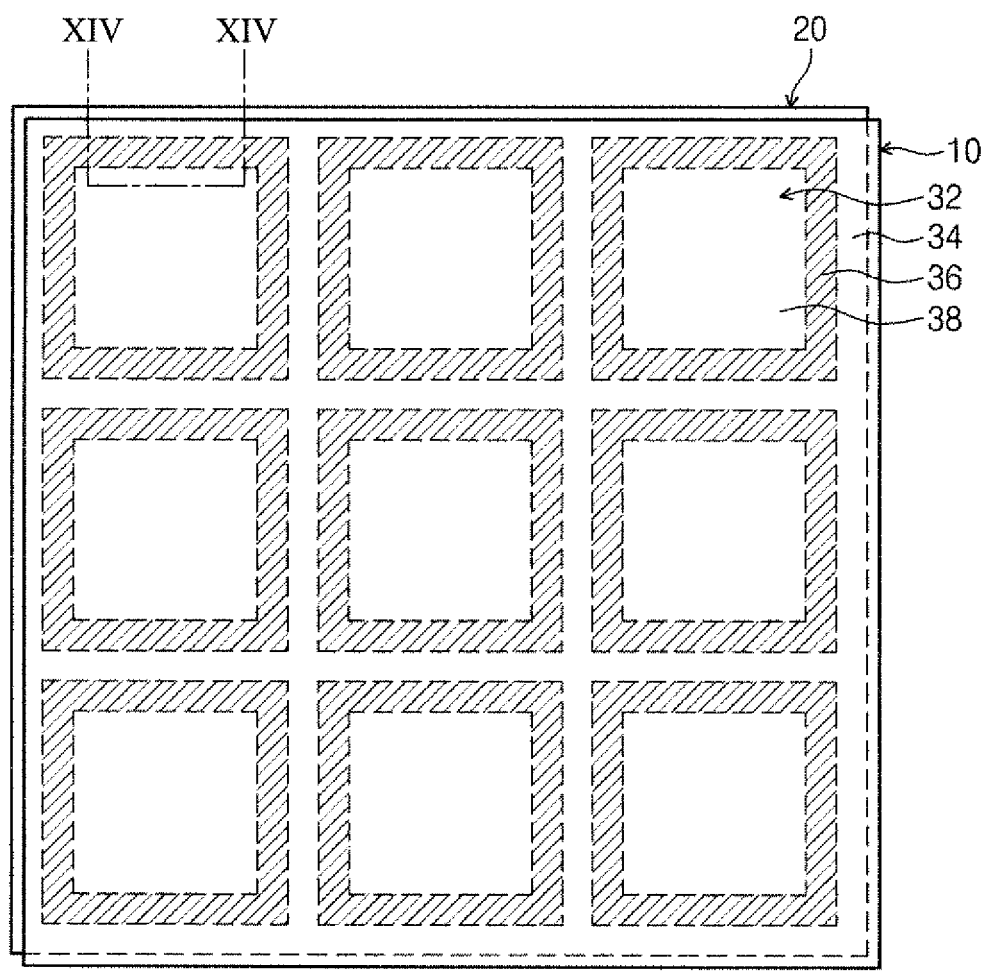
Figure 8:
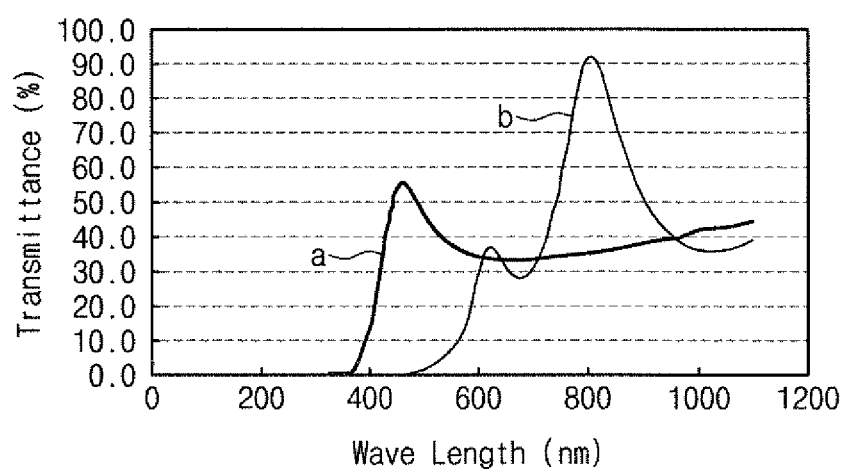
FIG. 8 is a graph illustrating transmittances of polycrystal silicon and amorphous silicon according to a wavelength change of light.
Figure 11:
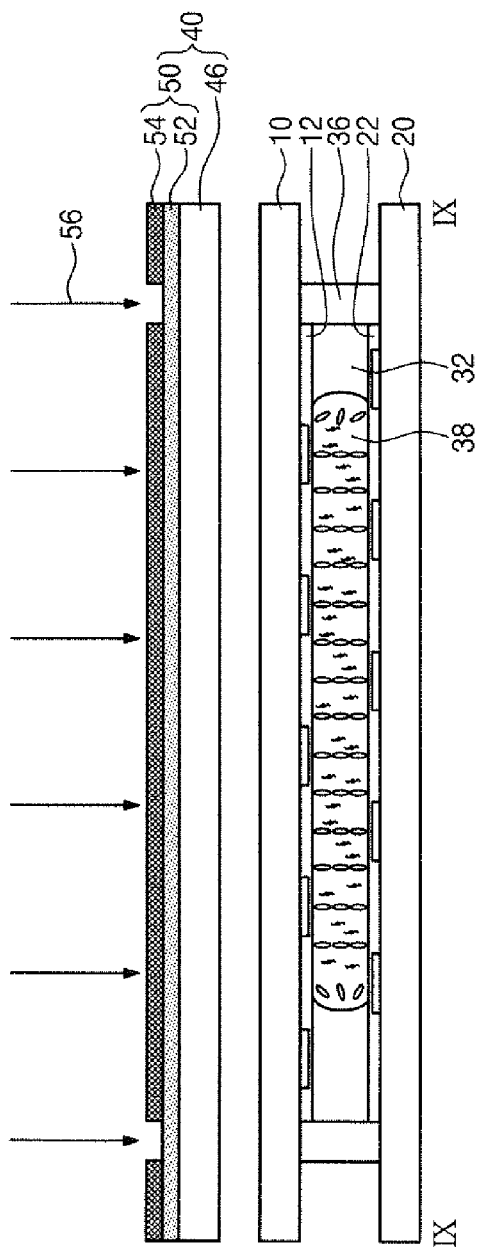
Figure 12:
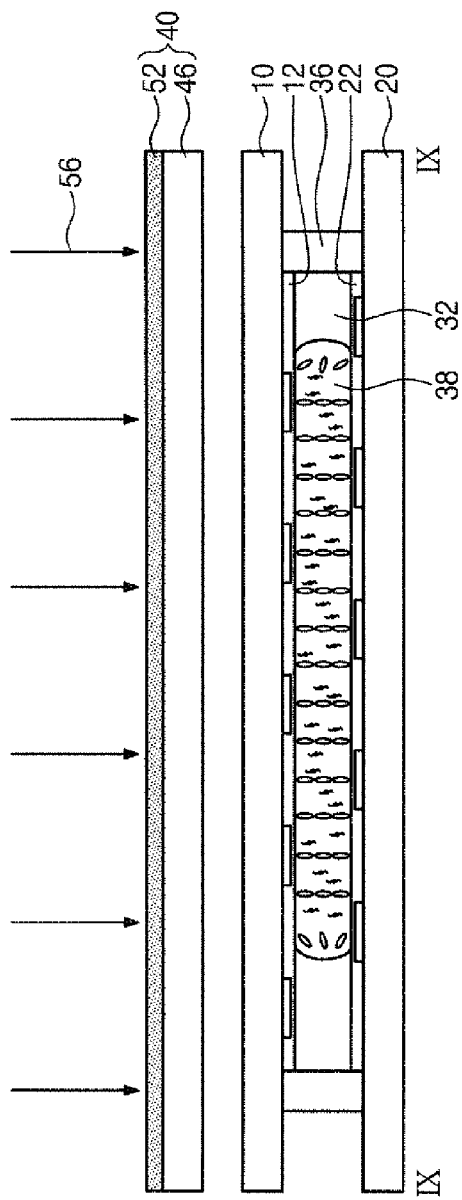
Figure 13:
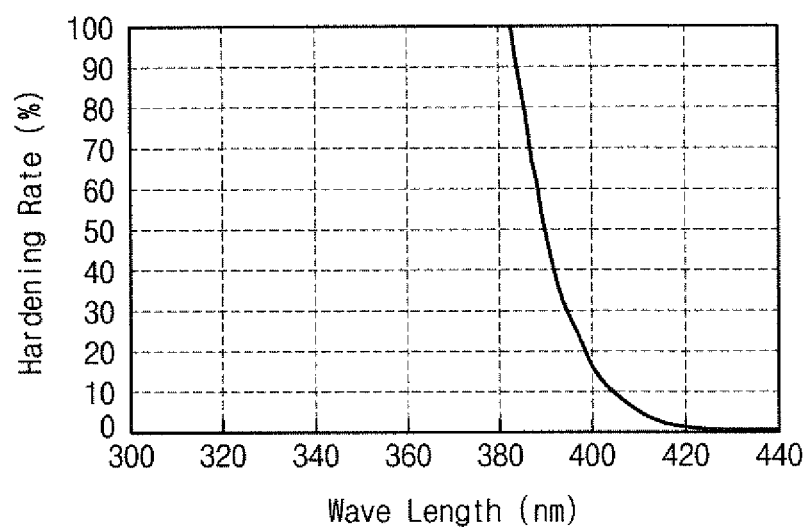
FIG. 13 is a graph illustrating a hardening rate of a sealant according to a wavelength change of light.

FIGS. 1 thru 7 are planar diagrams illustrating a method for fabricating a display device according to an embodiment of the present invention, FIG. 8 is a graph illustrating transmittances of polycrystal silicon and amorphous silicon according to a wavelength change of light, FIGS. 9 thru 12 are cross-sectional views illustrating photo-masks sectioned along a line IX-IX of FIG. 5 according to the first to fourth embodiments of the present invention, and FIG. 13 is a graph illustrating a hardening rate of a sealant according to a wavelength change of light.

Referring to FIG. 1, a thin film transistor substrate (not illustrated) and a color filter substrate 20 may be provided. The thin film transistor substrate and the color filter substrate 20 may respectively include cell regions 32 and peripheral regions 34 outside the cell regions 32. The cell regions 32 may include a plurality of pixels (not illustrated) defined by a data line (not illustrated) and a gate line (not illustrated) of the thin film transistor substrate. The peripheral regions 34 may include an encapsulation region (not illustrated) and a cutting region (not illustrated).

Although not illustrated, the thin film transistor substrate may be a first substrate including a thin film transistor (not illustrated). The thin film transistor substrate may include a storage electrode, a gate insulation layer, a passivation layer, a pixel electrode, and a first alignment layer. Also, the color filter substrate 20 may be a second substrate including a color filter. The color filter substrate 20 may include a black matrix layer, a common electrode, and a second alignment layer.

Figure 2:
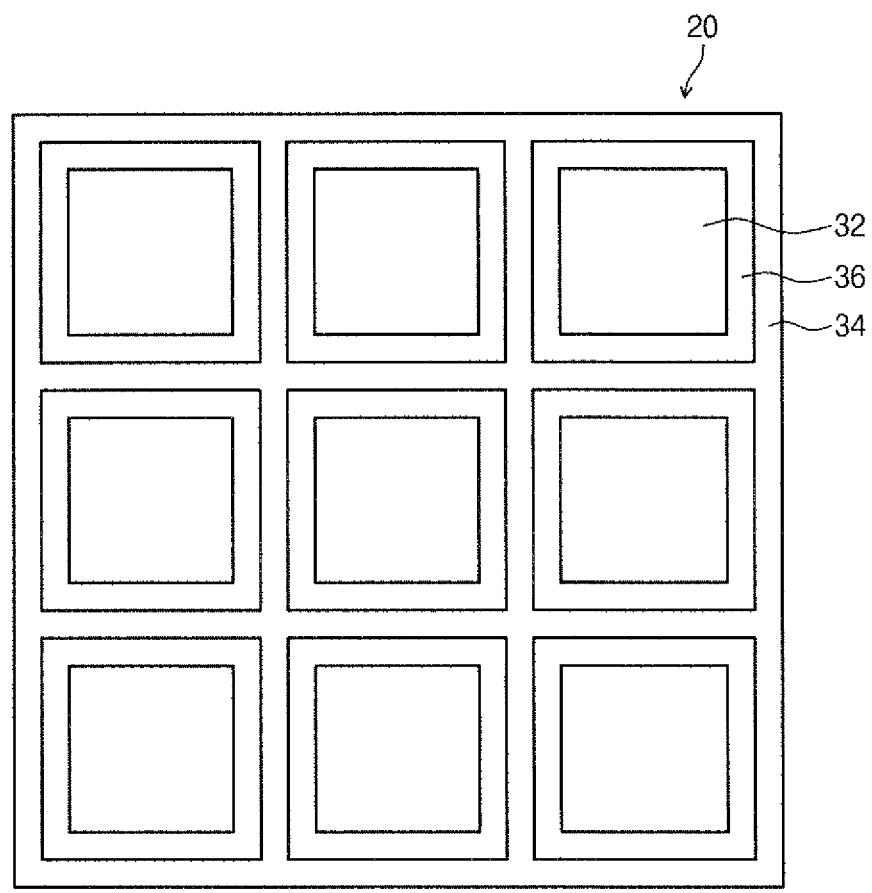

Referring to FIG. 2, a sealant 36 may be formed on the color filter substrate 20. The sealant 36 may surround the cell regions 32 at the peripheral regions 34. The sealant 36 may be printed on the color filter substrate 20 in a liquid state. For instance, the sealant 36 may include an acrylate-based first reactive resin, such as epoxy acrylate and urethane acrylate. Also, the sealant 36 may include a first photoinitiator which raises a hardening reaction of reactive resin. The first photoinitiator generates a radical by ultraviolet light, and may induce a hardening reaction of the first reactive resin. The first photoinitiator may include benzoin ether or benzophenone/amine having an excellent chemical resistance. For instance, the benzoin ether or benzophenone/amine may generate the radical by ultraviolet light having a wavelength range of from about 380 nm to about 400 nm.

Referring to FIG. 3, a liquid crystal 38 may be disposed on each of the cell regions 32 of the color filter substrate 20. The liquid crystal 38 may be disposed on the center of each cell region 32. The liquid crystal 38 may be disposed before formation of the sealant 36, and may be disposed simultaneously with formation of the sealant 36. The liquid crystal 38 may be disposed on the thin film transistor substrate 10 or the color filter substrate 20 where the sealant 36 is formed.

The liquid crystal 38 may include a VA mode, an IPS mode, and a TN mode. The liquid crystal 38 may also include Reactive Mesogens (RM) for compensating a viewing angle. The RM may include an acrylate-based second reactive resin, such as polyester acrylate or silicon acrylate. Also, the liquid crystal 38 may include a second photoinitiator. The second photoinitiator may include thioxanthone. For instance, the thioxanthone may generate a radical by ultraviolet light having a weak wavelength. The second photoinitiator may induce a reaction for connecting the RM to the first and second alignment layers by ultraviolet light having a wavelength smaller than about 360 nm.

Referring to FIG. 4, the thin film transistor substrate 10 may be joined to the color filter substrate 20. The thin film transistor substrate 10 and the color filter substrate 20 may be joined together in a low vacuum state. The thin film transistor substrate 10 and the color filter substrate 20 may also be joined together in a chamber (not illustrated). The liquid crystal 38 may have lower viscosity than that of the sealant 36. The liquid crystal 38 may gradually float from the centers of the cell regions 32 to edges between the thin film transistor substrate 10 and the color filter substrate 20. Even though the thin film transistor substrate 10 and the color filter substrate 20 are exposed to atmospheric pressure from low vacuum, the liquid crystal 38 may be filled within the cell regions 32 in a certain time. For instance, the liquid crystal 38 may be completely filled within the cell regions 32 after about 1 hour has passed under atmospheric pressure outside the chamber. The sealant 36 may join the thin film transistor substrate 10 and the color filter substrate 20 at the peripheral region 34.

Referring to FIGS. 5 and 8 thru 12, a photo-mask 40 for sheltering the cell regions 32 may be aligned on the thin film transistor substrate 10 and the color filter substrate 20. Ultraviolet light 56 (FIGS. 9 thru 12) may be made selectively incident on the sealant 36 using the photo-mask 40. For instance, ultraviolet light 56 may be incident within from about 1 minute to about 2 minutes from the outside of the chamber after joining the thin film transistor substrate 10 and the color filter substrate 20. This is because mismatching of the thin film transistor substrate 10 and the color filter substrate 20 may be minimized at a following process. Ultraviolet light 56 may be generated from a light source, such as a mercury discharge tube and a deuterium lamp. The light source may generate ultraviolet light having a wavelength range of from about 200 nm to about 400 nm. The liquid crystal 38 may be partially filled within the cell regions 32. As described above, this is because the liquid crystal 38 is gradually filled within the cell regions 32. For instance, the liquid crystal 38 may not be filled to edges of the cell regions 32 having square shapes.

The photo-mask 40 may include a transmissive region 42 (FIG. 5) and a shelter region 44. The transmissive region 42 may expose the sealant 36, and the shelter region 44 may shelter the cell regions 32. The shelter region 44 may shelter the peripheral region 34, except for the sealant 36. The photo-mask 40 may include a transparent substrate 46 (FIGS. 9 thru 12) and a light shielding layer 50. The light shielding layer 50 may include an absorption layer 52. The absorption layer 52 may include polycrystal silicon (Si) 'a' or amorphous silicon (Si) 'b'.

Referring to FIG. 8, the polycrystal silicon 'a' may be passed through by ultraviolet light 56 having a wavelength larger than about 380 nm. The photo-mask 40, including the absorption layer 52 of the polycrystal silicon 'a', may be passed through by ultraviolet light 56 having a wavelength range of from about 380 nm to about 400 nm. Also, the absorption layer 52 of the polycrystal silicon 'a' may absorb ultraviolet light having a wavelength smaller than about 380 nm. The amorphous silicon 'b' may be passed through by visible light and infrared light having a wavelength larger than about 500 nm. The absorption layer 52 of the amorphous silicon 'b' may absorb light of all ultraviolet regions. Embodiments of the photo-mask 40, including the absorption layer 52 composed of the polycrystal silicon 'a' or the amorphous silicon 'b', will be described.

Referring to FIGS. 8 and 9, the photo-mask 40 according to the first embodiment of the present invention may include the absorption layer 52 and a reflection layer 54 on the shelter region 44 of the transparent substrate 46. The absorption layer 52 and the reflection layer 54 may be the light shielding layer 50. The reflection layer 54 may include a chrome (Cr) layer. The absorption layer 52 may include the polycrystal silicon 'a' or the amorphous silicon 'b'. Ultraviolet light 56 incident on the shelter region 44 may be reflected by the reflection layer 54 upward from the photo-mask 40. The light 56 incident on the transmissive region 42 may be absorbed by the sealant 36. The light 56 passing through the transmissive region 42 may include all ultraviolet regions of wavelength smaller than about 400 nm. The light 56 may be reflected toward the photo-mask 40 by an upper surface of the thin film transistor substrate 10 corresponding to the transmissive region 42.

Ultraviolet light 56, reflected by the upper surface of the thin film transistor substrate 10, may be absorbed by the absorption layer 52. For instance, the absorption layer 52 of the amorphous silicon 'b' may absorb light of all ultraviolet regions having a wavelength smaller than about 400 nm.

The absorption layer 52 of the polycrystal silicon 'a' may absorb ultraviolet light 56 having a wavelength smaller than about 380 nm, and may be passed through by ultraviolet light 56 having a wavelength range of from about 380 nm to about 400 nm. Ultraviolet light 56 having a wavelength range of from about 380 nm to about 400 nm may be re-reflected by the reflection layer 54 toward the liquid crystal 38 of the cell regions 32. The liquid crystal 38 may not be polymerized by ultraviolet light 56 having a wavelength range of from about 380 nm to about 400 nm. This is because the second photo-initiator of the liquid crystal 38 is polymerized by ultraviolet light 56 having a wavelength smaller than about 380 nm. Therefore, the photo-mask 40 according to the first embodiment of the present invention may prevent stain defects due to the polymerization of the liquid crystal 38.

Referring to FIGS. 8 and 10, the photo-mask 40 according to the second embodiment of the present invention may include the absorption layer 52 on the shelter region 44 of the transparent substrate 46. The absorption layer 52 may absorb ultraviolet light 56 having a wavelength smaller than about 380 nm which polymerizes the liquid crystal 38 at the shelter region 44. The absorption layer 52 may include the polycrystal silicon 'a' or the amorphous silicon 'b'.

The absorption layer 52 of the polycrystal silicon 'a' may absorb ultraviolet light 56 having a wavelength smaller than about 380 nm. The absorption layer 52 of the polycrystal silicon 'a' may transmit ultraviolet light 56 having a wavelength range of from about 380 nm to about 400 nm to the liquid crystal 38. The liquid crystal 38 may not be polymerized by ultraviolet light 56 having a wavelength range of from about 380 nm to about 400 nm. The absorption layer 52 of the amorphous silicon 'b' may absorb light of all ultraviolet regions having a wavelength smaller than about 400 nm. Therefore, the absorption layer 52 of the polycrystal silicon 'a' or the amorphous silicon 'b' may absorb ultraviolet light 56 having a wavelength smaller than about 380 nm, which polymerizes the liquid crystal 38 at the shelter region 44.

The light 56 transmitted to the transmissive region 42 of the transparent substrate 46 may include an ultraviolet region having a wavelength smaller than about 400 nm. The light 56 transmitted to the transmissive region 42 may be reflected toward the photo-mask 40 by an upper surface of the thin film transistor substrate 10. The absorption layer 52 of the photo-mask 40 may absorb and transmit ultraviolet light 56 reflected by the upper surface of the thin film transistor substrate 10. The absorption layer 52 of the polycrystal silicon 'a' may absorb ultraviolet light having a wavelength smaller than about 380 nm. The absorption layer 52 of the polycrystal silicon 'a' may transmit ultraviolet light 56 having a wavelength range of from about 380 nm to about 400 nm to an upper part of the photo-mask 40. The absorption layer 52 of the amorphous silicon 'b' may absorb light of all ultraviolet regions having a wavelength smaller than about 400 nm. Therefore, the photo-mask 40 according to the second embodiment of the present invention may prevent stain defects due to the polymerization of the liquid crystal 38.

Referring to FIGS. 8 and 11, the photo-mask 40 according to the third embodiment of the present invention may include the absorption layer 52 over the transparent substrate 46 and the reflection layer 54 on the transparent substrate 46 of the shelter region 44. The reflection layer 54 may reflect light 56 of all ultraviolet regions having a wavelength smaller than about 400 nm upward from the photo-mask 40 toward the shelter region 44. The absorption layer 52 may be exposed at the transmissive region 42. The absorption layer 52 may include the polycrystal silicon 'a' which absorbs ultraviolet light 56 having a wavelength smaller than about 380 nm. The absorption layer 52 exposed at the transmissive region 42 may absorb ultraviolet light 56 having a wavelength smaller than about 380 nm, and may transmit ultraviolet light 56 having a wavelength range of from about 380 nm to 400 nm. Ultraviolet light 56 having a wavelength range of from about 380 nm to 400 nm may not induce the polymerization of the liquid crystal. Ultraviolet light 56 having a wavelength range of from about 380 nm to 400 nm may selectively harden the sealant 36. Therefore, the photo-mask 40 according to the third embodiment of the present invention may prevent stain defects due to the polymerization of the liquid crystal 38.

Referring to FIGS. 8 and 12, the photo-mask 40 according to the fourth embodiment of the present invention may include the absorption layer 52 over the transparent substrate 46. The absorption layer 52 may include the polycrystal silicon 'a'. The absorption layer 52 may absorb ultraviolet light 56 having a wavelength smaller than about 380 nm, and may transmit ultraviolet light 56 having a wavelength range of from about 380 nm to 400 nm. Ultraviolet light 56 having a wavelength range of from about 380 nm to 400 nm may selectively harden the sealant 36. Therefore, the photo-mask 40 according to the fourth embodiment of the present invention may prevent stain defects due to the polymerization of the liquid crystal 38.

Referring to FIGS. 6 thru 13, the sealant 36 may be reactive to ultraviolet light 56 having a wavelength range of from about 380 nm to 400 nm so as to be hardened. As described above, the sealant 36 may include the first photoinitiator and the first reactive resin. The first photoinitiator may generate the radical by ultraviolet light 56 having a wavelength range of from about 380 nm to 400 nm. Also, the radical may induce a hardening reaction of the first reactive resin. Accordingly, the sealant 36 may be hardened by ultraviolet light 56 having a wavelength range of from about 380 nm to 400 nm transmitted from the photo-mask 40 according to the first thru fourth embodiments of the present invention. The horizontal axis of FIG. 13 denotes a wavelength of light, and the vertical axis thereof denotes a hardening rate. The hardening rate may be measured by a Fourier Transform Spectroscopy (FT-IR) device.

Referring to FIG. 7, if a certain time has passed after the sealant 36 is hardened, the liquid crystal 38 may be completely filled within the cell regions 32. As described above, if about one hour under the atmospheric pressure has passed, the liquid crystal 38 may be completely filled within the cell regions 32. The liquid crystal may be aligned between the thin transistor film substrate 10 and the color filter substrate 20 by ultraviolet light having a wavelength smaller than about 380 nm as described below.

FIGS. 14 thru 17 are cross-sectional views along a line XIV-XIV of FIG. 7 illustrating a method for aligning the liquid crystal.

Referring to FIG. 14, the liquid crystal 38 may include directors 37, reactive mesogens 39, and the second photoinitiator between the thin film transistor substrate 10 and the color filter substrate 20. The directors 37 may include monomers having polarizations. The directors 37 may be arranged in a certain direction between a first alignment layer 12 of the thin film transistor substrate 10 and a second alignment layer 22 of the color filter substrate 20. For instance, the directors 37 may be arranged vertically relative to the thin film transistor substrate 10 and the color filter substrate 20 by the polarizations.

Referring to FIG. 15, by applying a voltage provided by a power source 60 to a pixel electrode 14 of the thin film transistor substrate 10 and a common electrode 24 of the color filter substrate 20, the directors 37 of the liquid crystal 38 may be rotated. The directors 37 of the liquid crystal 38 may be rotated along an electric field induced between the pixel electrode 14 and the common electrode 24.

Figure 16:
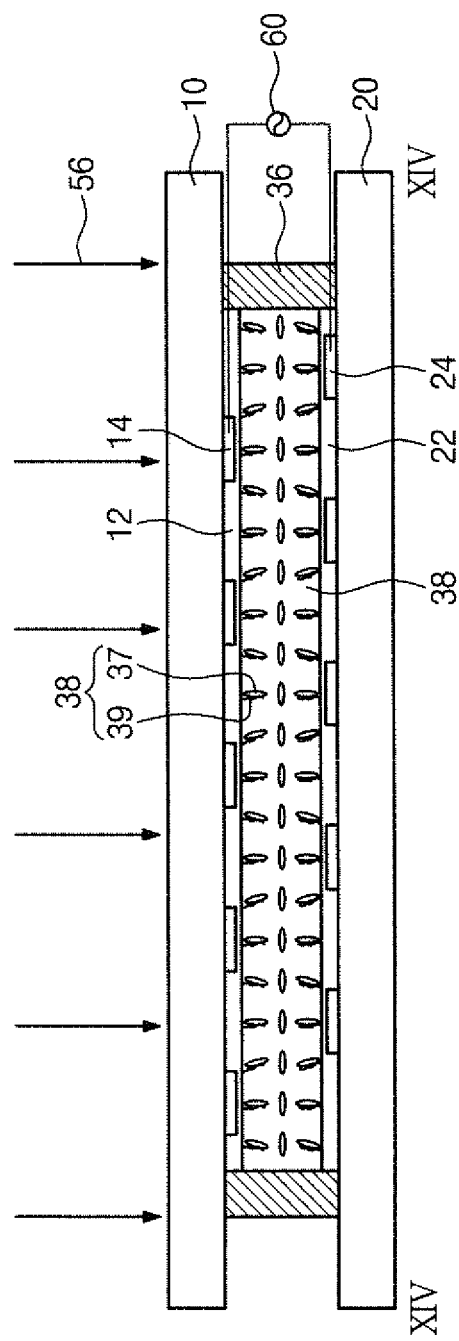

Referring to FIG. 16, by irradiating ultraviolet light 56 onto the liquid crystal 38, the reactive mesogens 39 may be networked to surfaces of the first and second alignment layers 12 and 22, respectively. The reactive mesogens 39 may be networked to the surfaces of the first and second alignment layers 12 and 22, respectively, by the second photoinitiator which is polymerized by ultraviolet light 56. The second photoinitiator may be polymerized by ultraviolet light 56 having a wavelength smaller than about 380 nm. The reactive mesogens 39 may be most stabilized on the surfaces of the first and second alignment layers 12 and 22, respectively. The reactive mesogens 39 may be networked along the directors 37 on the surfaces of the first and second alignment layers 12 and 22, respectively. The director 37 may be rotated or inclined by the electric field (not illustrated) induced between the pixel electrode 14 and the common electrode 24. Accordingly, the reactive mesogens 39 may be networked at a certain pretilt angle on the surfaces of the first and second alignments layers 12 and 14, respectively.

Figure 17:
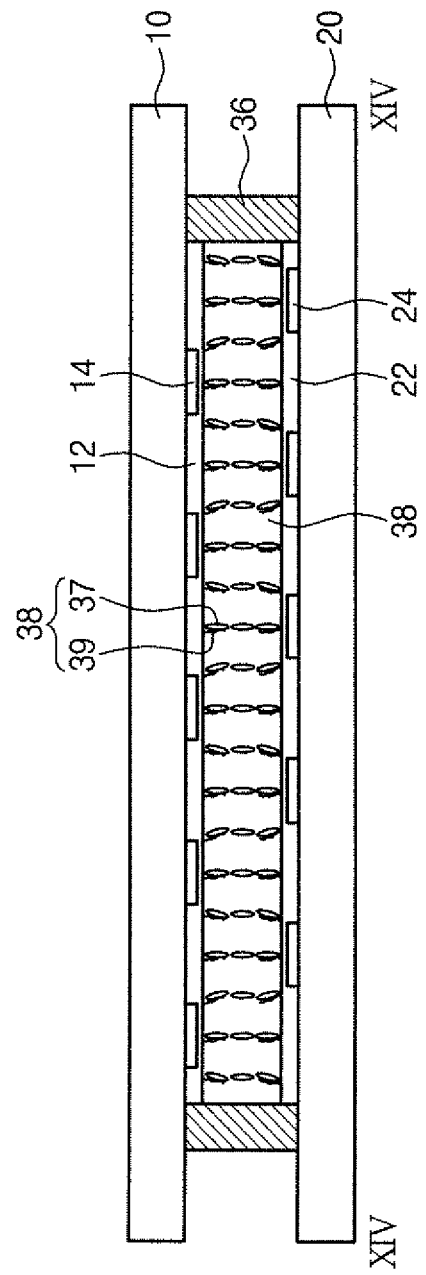

Referring to FIG. 17, the power source 60 applying a voltage to the pixel electrode and the common electrode may be removed. The directors 37 adjacent to the surfaces of the first and second alignment layers 12 and 22, respectively, may be aligned at a pretilt angle by the reactive mesogens 39. The reactive mesogens 39 may restrain the directors 37 on the surfaces of the first and second alignment layers 12 and 22, respectively. That is, the reactive mesogens 39 may fix the pretilt angle of the directors 37 adjacent to the first and second alignment layers 12 and 22, respectively. The directors 39 located at a center between the thin film transistor substrate 10 and the color filter substrate 20 may be vertically arranged by polarizations.

As described above, the photo-mask according to the embodiments of the present invention may include an absorption layer of the polycrystal silicon which transmits ultraviolet light having a wavelength range of from about 380 nm to about 400 nm and absorbs ultraviolet light having a wavelength smaller than about 380 nm. The sealant may include the first photoinitiator which is polymerized by ultraviolet light having a wavelength range of from about 380 nm to about 400 nm. The liquid crystal may include the second photoinitiator which is polymerized by ultraviolet light having a wavelength smaller than 380 nm. Therefore, the sealant can be selectively hardened by ultraviolet light having a wavelength range of from about 380 nm to about 400 nm transmitted from the photo-mask.

The above-disclosed subject matter is to be considered illustrative, and not restrictive, and the appended claims are intended to cover all such modifications, enhancements and other embodiments which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method for fabricating a liquid crystal display device, comprising the steps of:
   preparing a first substrate and a second substrate comprising cell regions;
   forming a sealant at a peripheral region of the cell regions of at least one of the first and second substrates;
   dispensing a liquid crystal within the cell regions;
   joining the first and second substrates;
   disposing a photo-mask above one of the first substrate and the second substrate, the photo-mask comprising a transparent substrate and a light shielding layer borne on a surface of the transparent substrate, the light shielding layer comprising a filter layer which is configured to absorb ultraviolet light with a first wavelength smaller than a predetermined wavelength and which is configured to be transmissive to ultraviolet light with a second wavelength greater than the predetermined wavelength; and
   selectively hardening the sealant with ultraviolet light passing through the photo-mask,
   the ultraviolet light having the second wavelength not inducing polymerization of the liquid crystal.

2. The method of claim 1, wherein the sealant comprises a first reactive resin and a first photoinitiator.

3. The method of claim 2, further wherein the first photoinitiator is reactive to ultraviolet light having a wavelength range of from about 380 nm to about 400 nm.

4. The method of claim 3, further wherein the first photoinitiator comprises one of benzoin ether and benzophenone/amine.

5. The method of claim 1, wherein a layer of the liquid crystal comprises a second reactive resin and a second photoinitiator.

6. The method of claim 5, further wherein the second photoinitiator is reactive to ultraviolet light having a wavelength smaller than about 380 nm.

7. The method of claim 6, further wherein the second photoinitiator comprises thioxanthone.

8. The method of claim 1, further wherein the filter layer comprises one of polycrystal silicon and amorphous silicon.

9. The method of claim 8, further wherein the polycrystal silicon absorbs ultraviolet light having a wavelength smaller than about 380 nm.

10. The method of claim 1, wherein the predetermined wavelength is within a range of from about 380 nm to about 400 nm.

11. The method of claim 1, wherein the light shielding layer further comprises a reflection layer formed on the filter layer.

12. A method for fabricating a liquid crystal display device, comprising the steps of:
    providing a liquid crystal display unit formed by first and second substrates joined by a sealant at a peripheral region of a plurality of cell regions, each cell region containing a liquid crystal;
    disposing a photo-mask above one of the first and second substrates, the photo-mask comprising a transparent substrate and a light shielding layer borne on a surface of the transparent substrate, the light shielding layer comprising a filter layer absorbing ultraviolet light with a first wavelength smaller than a predetermined wavelength and transmitting ultraviolet light with a second wavelength greater than the predetermined wavelength, the ultraviolet light having the second wavelength not inducing polymerization of the liquid crystal; and
    selectively hardening the sealant with ultraviolet light passing through the photo-mask.

* * * * *